(12) United States Patent
Gerber et al.

(10) Patent No.: US 9,348,349 B2
(45) Date of Patent: May 24, 2016

(54) CONTROL FOR VOLTAGE REGULATORS

(71) Applicant: Texas Instruments Deutschland GmbH, Freising (DE)

(72) Inventors: Johannes Gerber, Unterschleissheim (DE); Matthias Arnold, Freising (DE); Ronald Nerlich, Freising (DE)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 138 days.

(21) Appl. No.: 14/245,293

(22) Filed: Apr. 4, 2014

(65) Prior Publication Data
US 2015/0286231 A1   Oct. 8, 2015

(51) Int. Cl.
*G05F 1/00* (2006.01)
*G05F 3/16* (2006.01)
*G05F 3/20* (2006.01)
*H02H 3/08* (2006.01)
*H02H 9/02* (2006.01)
*G05F 1/56* (2006.01)
*G01R 19/00* (2006.01)

(52) U.S. Cl.
CPC . *G05F 1/56* (2013.01); *G01R 19/00* (2013.01)

(58) Field of Classification Search
USPC ......... 323/241, 266, 274, 283, 284, 312, 315; 361/18, 93.1, 93.2
See application file for complete search history.

(56) References Cited

U.S. PATENT DOCUMENTS

| | | | | |
|---|---|---|---|---|
| 2009/0189577 A1* | 7/2009 | Lin | ............................ | G05F 1/56 323/273 |
| 2009/0256540 A1* | 10/2009 | Yang | ........................ | G05F 1/575 323/282 |
| 2013/0293986 A1* | 11/2013 | Lerner | ..................... | G05F 1/573 361/18 |

* cited by examiner

*Primary Examiner* — Adolf Berhane
*Assistant Examiner* — Gary Nash
(74) *Attorney, Agent, or Firm* — John R. Pessetto; Frank D. Cimino

(57) ABSTRACT

A mixed signal approach is applied to detect an output voltage condition as applied to a load. A current mode monitoring approach can be adopted and applied in discrete time using a mixed analog and digital approach. For application to various low drop-out voltage regulator situations, a sensing transistor can be connected in parallel with a feedback loop transistor of the low drop-out voltage regulator circuit to create a sensing current that is proportional to the current passing through the feedback loop transistor and thus the output current provided to the load. This sensing approach can be adapted to sense both overload and light load conditions to allow dynamic power control of the device.

12 Claims, 10 Drawing Sheets

CONTROL FOR VOLTAGE REGULATORS

TECHNICAL FIELD

This invention relates generally to controlling provision of voltage to microcontrollers, processors, and related peripherals, and more specifically, to controlling the voltage output from a low drop-out voltage regulator.

BACKGROUND

Microprocessors or controllers are used in a wide variety of applications to control the activities of a variety of devices. Such electronic devices require a power supply in order to perform their functions. Depending on the design of a particular device, the voltage applied may need to be within certain parameters to ensure proper function of the device receiving the output power. Accordingly, various methods are known for controlling an output power that is applied to electronic devices such as microprocessors, controllers, and their peripherals.

One particular type of structure that is used to provide a power or voltage to microcontrollers, controllers, and their peripherals is called a low drop-out voltage regulator (LDO). Generally speaking, low drop-out voltage regulators monitor an aspect of the power applied to an electronic device such as a microprocessor or associated peripheral and provides a feedback that allows control circuitry to maintain the power within certain parameters. An example environment in which a low drop-out voltage regulator is applied is illustrated in FIG. 1. An electronic device 100 includes powered electronic aspects 105 such as a central processing unit and associated peripherals that receive power from a battery 110. The battery in this case represents a system voltage that is available to the electronic device 100, which voltage may come from a battery or any other available power source. The LDO 115 operates in both an analog domain and a digital domain such that the LDO is able to provide an analog output power to the electronic aspects 105 while being controlled at least in part in the digital domain. For example, the LDO 115 may receive a reference current or voltage from the reference biasing supervision circuit 120, which reference current or voltage is typically provided in an analog format to the LDO 115. Moreover, the LDO is able to provide a feedback signal that can be used by a power management circuit 125 that, in turn, can control various elements of the LDO 115 that operate in a digital domain, which modifications to those elements help to control the output power that is provided to the electronic aspects 105. The clock management circuit 130 helps by providing information to the power management circuit 125 to further assist in controlling the operating parameters of the LDO 115.

FIG. 2 illustrates one example prior art approach to an LDO 115. In this illustration, the circuit elements covered by a diagonal arrow are all elements that are controlled in the digital domain, for example, through receipt of signals from a power management circuit 125. The circuit elements indicated in box 205 constitute the output stage of the LDO that provides an output power VCORE, which output power is provided to the electronic aspects 105. Control circuitry 212 of the LDO 115 uses a reference voltage VREF and a feedback voltage VFB to determine how to modify the digitally controlled elements to regulate the power output at VCORE.

One problem with such prior art low drop-out voltage regulators is the inability to keep up the power management features in the face of a sudden drop in applied voltage AVDD. In other words, the power source 110 provides an input power AVDD that may vary based on a load applied to the input power or other aspects of the operating electronic device 100. The LDO 115 monitors the effect of those changes and changes the control of the input voltage AVDD to try to maintain the output voltage VCORE within acceptable parameters. The circuitry elements, however, that are used to monitor these power aspects may not be able to react quickly enough to maintain the output voltage VCORE in the face of a sudden drop of the input voltage AVDD. For example, with reference to FIGS. 3 and 4, a typical input voltage AVDD in one application can range between 2.7 and 3.6 volts. The typical output voltage that is applied to power one or more electrical aspects (also called the load) is, in this case, a VCORE of about 1.2 volts. Should there be an overloading of the input power AVDD, the input power received by the low drop-out voltage regulator can drop, for example, from an initial voltage of between 2.7 and 3.6 volts to 2.0 volts or less. If that drop in input voltage AVDD occurs over too short of a timeframe, for example, between 10 and 400 microseconds, the circuitry of the low drop-out voltage regulator may not be able to maintain the output voltage VCORE. As illustrated in FIG. 3, in the face of this condition, VCORE may momentarily drop from 1.2 volts to 0 volts at point 306. Depending on the electronic aspects being powered through the low drop-out voltage regulator, a momentary drop of power could result in loss of data or other serious interruptions in the operation of these so powered electronics.

The cause of such a drop in output voltage VCORE can be further understood with reference to FIG. 4. More specifically, at the output stage 405 of the given low drop-out voltage regulator, a drop in the input voltage AVDD is illustrated by a first arrow 407. This drop in voltage, in turn causes the drop in voltage at the gate of a passgate transistor 410 through which current flows to the output of the low drop-out voltage regulator VCORE. The drop in voltage at the passgate transistor's 410 gate causes a drop in current that passes through the passgate transistor 410. The drop in current, in turn, causes a drop in voltage at the output voltage VCORE that is applied to the load 415. If this series of drops happens too quickly, the loop bandwidth or regulation speed of the low drop-out voltage regulator may simply not be able to keep up. For example, the reaction of the passgate transistor 410 and a feedback transistor 456, which provides a feedback signal to the low drop-out voltage regulators control circuitry, may not occur in time for the control circuitry to modify the operating parameters of other aspects of the low drop-out voltage regulator to maintain the output voltage VCORE at its given value. Moreover, certain low drop-out voltage regulators that are controlled in part via digital domain have limited combinations of peripheral and clock combinations that can be applied to react to such voltage drops.

Accordingly, a variety of modifications to these voltage providers have been attempted, each having its own set of drawbacks. In this example of FIG. 4, a comparator circuit 420 is connected to receive the output voltage VCORE from the low drop-out voltage regulator circuit 405. The comparator circuit 420 in this case includes a comparator circuit element 430 that compares the output voltage VCORE to a reference voltage VREF and outputs corresponding comparison signal indicated as VCORE_OK. This direct voltage monitoring approach can be made very accurate; however, this approach consumes an excess amount of additional current, thereby increasing the overall power usage of the circuit. Also, the addition of a voltage reference element and the comparator circuit elements causes an increase in the footprint of the circuit elements in the silicon. Moreover, depending on the voltage range to be measured, additional reference voltage or resistor divider circuitry elements must be added, thereby adding additional power consumption. Although this method of detecting the output voltage VCORE is accurate, by operating in a voltage domain, this approach is slower than various current mode detection approaches consuming the same or less amount of current.

Another prior art approach to controlling a low drop-out voltage regulator is illustrated in FIG. 5. Here, an example current mode monitoring approach where a sensing circuit 520 is connected to sense a current ILOAD that flows through a transistor 522 connected in parallel with the passgate transistor 510 through which the primary load current ILOAD passes. A current source 524 provides a reference current IREF for comparison to the current passing through the parallel transistor 522 by a comparator circuit element 530, such as a Schmidt Trigger Circuit Element as known in the art. Unfortunately, this approach illustrated in FIG. 5 suffers from the disadvantage that an overload event can occur that drops the input voltage AVDD and thus the output voltage VCORE below an acceptable level while the measured current stays within a valid range. In other words, the sensing approach can fail in situations where the voltage drop occurs too quickly relative to the measured current, such that this approach may not reliably detect the overload state caused by supply drops.

A further prior art approach to monitoring and controlling the output voltage from a low drop-out voltage regulator is illustrated in FIG. 6. In this approach, the current mirror circuitry 620 is connected to monitor current at a variety of points within the output stage 605 of the low drop-out voltage regulator circuit. Again, the primary current sensing is done with relation to the sensing transistor 622 that is connected in parallel to the passgate transistor 610. Accordingly, this design suffers a similar disadvantage as that of the approach of FIG. 5 where an unacceptable delay between the current drop and sensing the current drop can occur. Moreover, most low drop-out voltage regulators use bias current adaptation within the analog domain and done in continuous time. The resistors and transistors that make up the low drop-out voltage regulator circuit are not easily adapted or controlled in the analog domain. Moreover, the dynamic range of sensing the current is limited to particular ranges and limited node voltage swings.

SUMMARY

Generally speaking, and pursuant to these various embodiments, a mixed signal approach is applied to detect an output voltage condition as applied to a load. More specifically, a current mode monitoring approach can be adopted, that is, applied in discrete time using a mixed analog and digital approach. For application to various low drop-out voltage regulator situations, for example, a sensing transistor can be connected in parallel with a feedback loop transistor of the low drop-out voltage regulator circuit to create a sensing current that is proportional to the current passing through the feedback loop transistor, i.e., the output current provided to the load. Instead of measuring the output voltage directly, or measuring the load current more directly, this approach provides a fast sensing implementation because of its integration within the low drop-out voltage regulator. The approach is relatively simple to implement using a limited number of elements, which in turn provides advantages in using less silicon space and less power as compared to other approaches to monitoring and controlling a low drop-out voltage regulator output. These and other benefits may become clearer upon making a thorough review and study of the following detailed description.

BRIEF DESCRIPTION OF THE DRAWINGS

The above needs are at least partially met through provision of the control for voltage regulators described in the following detailed description, particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set

DETAILED DESCRIPTION

Figure 7:
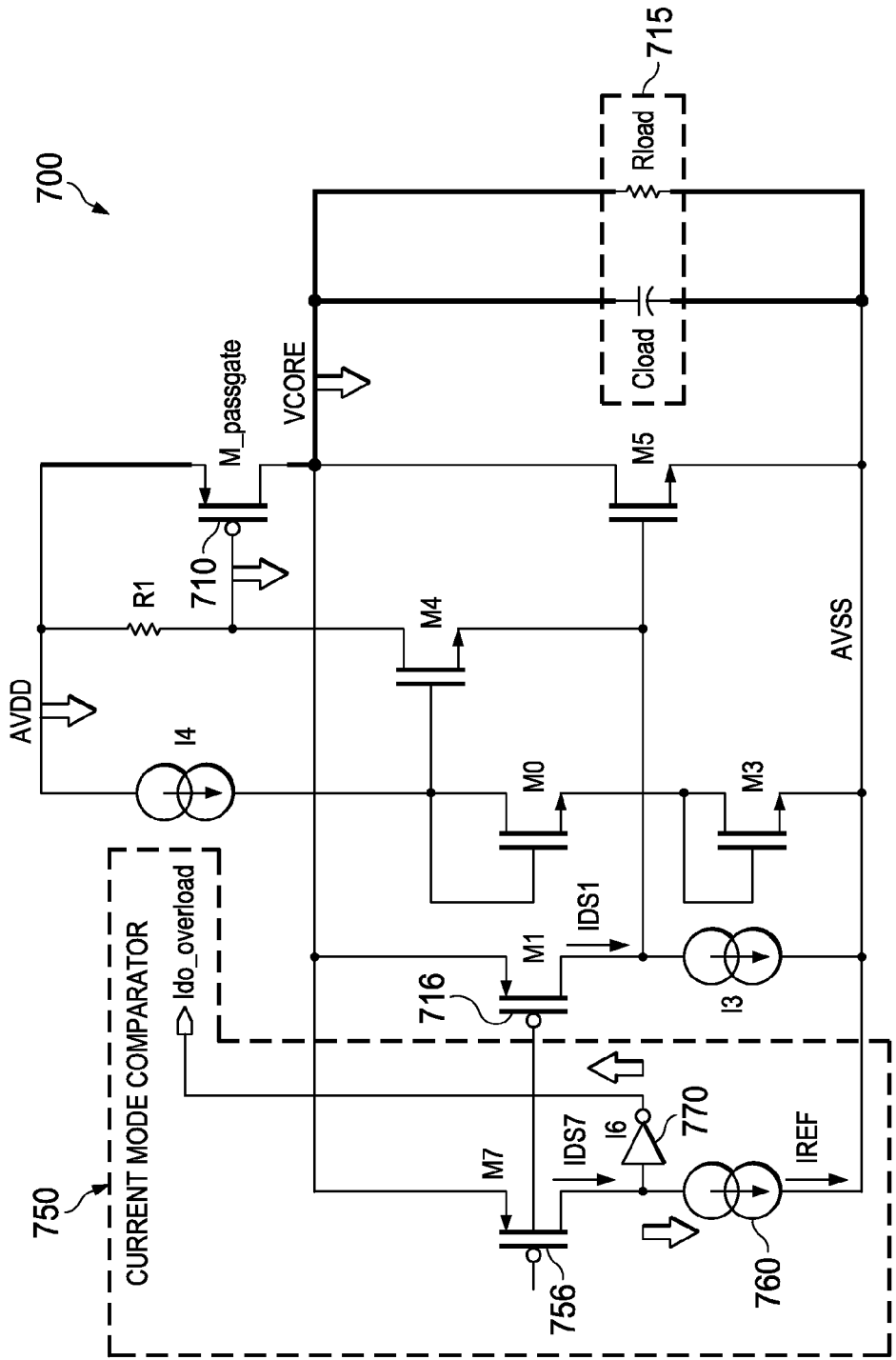
FIG. 7 comprises a circuit diagram illustrating one example approach for monitoring a low voltage drop-out regulator as configured in accordance with various embodiments of the invention.

Referring now to the drawings and, in particular, FIG. 7, an example approach to current mode monitoring of a low drop-out voltage regulator circuit in a discrete time and mixed analog/digital approach will be described. In this example, an apparatus for detecting a load and an input power includes a low drop-out voltage regulator circuit 700 configured to provide an output load VCORE to a load 715. The load 715 comprises resistive and capacitive elements, which represent how the load 715 is experienced from the point of view of the low drop-out voltage regulator circuit 700. The output voltage VCORE applied to the load 715 is a result of conditioning an input voltage AVDD that results in a current being passed through a passgate transistor 710 of the low drop-out voltage regulator circuit 700. This output voltage VCORE is also connected to pass a current IDS1 through a feedback transistor 716 within the low drop-out voltage regulator circuit 700. A current mode comparator circuit 750 is connected to the low drop-out voltage regulator circuit 700 to monitor a low drop-out voltage regulator circuit current IDS1 driven by the output voltage VCORE of the low drop-out voltage regulator circuit 700. The current mode comparator circuit 750 is configured to monitor the low drop-out voltage regulator circuit current IDS1 in a discrete time mixed analog/digital approach. FIG. 7 illustrates one particular example of this approach.

In this example, the current mode comparator circuit 750 includes a sensing transistor 756 connected in parallel with the feedback loop transistor 716. This sensing transistor 756 is configured to output a sensing current IDS7 proportional to the low drop-out voltage regulator circuit current IDS1. The current mode comparator circuit 750 further includes a reference current source 760 configured to provide a reference current IREF. A comparator circuit 770 is configured to perform a comparison between the sensing current IDS7 and the reference current IREF and to output a comparison signal based on the comparison. In a typical embodiment, the feedback loop transistor 716 is a PMOS transistor having a drain and a source with the source connected to receive the output voltage VCORE. The low drop-out voltage regulator circuit current IDS1 is, in this approach, a current emitted from the drain of the feedback loop transistor 716. By one approach, the comparator circuit 770 is a Schmitt-Trigger circuit configured to output a digital flag signal in response to the sensing current IDS7 dropping below the reference current IREF. In other words, the comparator circuit 770 compares the sensing current IDS7 to the reference IREF and provides a one-bit signal depending on which of the two currents is higher than the other. In FIG. 7, the signal is indicated as the LDO_OVERLOAD signal, which can be provided to a controller element that controls the operating parameters of the low drop-out voltage regulator circuit 700. So configured, a fast and reliable approach to monitoring the output of a low voltage drop-out regulator circuit is accomplished through addition of only three circuit elements: the sensing transistor 756, the current reference source 760, and the comparator circuit 770. Thus, very little area is taken up in the silicon for building the circuit and very low additional power is taken up by this sensing approach, which can be particularly advantageous in low power microcontroller applications.

Turning to FIG. 8, a variety of signals and load conditions for the low drop-out voltage regulator circuit and sensing approach are illustrated. Here, an output voltage VCORE starts at a maximum level between times T-0 and T-1. At T-1, the output voltage VCORE begins to drop. The low drop-out voltage regulator circuit current IDS1 and sensing current IDS7 are proportional to each other and, thus, move in unison as shown in a single trace in the graph of FIG. 8. In this example, the current IDS1, 7 starts at a maximum level at T-0, and at a time T-2 after the output voltage VCORE begins to drop at time T-1, the current IDS1, 7 begins to drop. The difference between time T-1 and time T-2 represents the lag in sensing the current drop relative to the output voltage VCORE drop. As the output voltage VCORE continues to drop, the currents IDS1 and IDS7 also drop. The reference current IREF is set to a level IREF min such that the sensed IDS7 will cross the reference current IREF min at the point of overload represented in the graph of FIG. 8 at time T-4. In this approach, an overload is detected prior to the output voltage VCORE reaching a minimum tolerable voltage, which occurs at time T-5 after the overload condition is sensed at time T-4 by the given sensing approach. Accordingly, although there is a lag between the initial drop in the output voltage VCORE and the corresponding drop in the sensed current IDS7, that lag is not so great so as to miss sensing an overload condition prior to the output voltage VCORE is reaching a critical stage.

Figure 1:
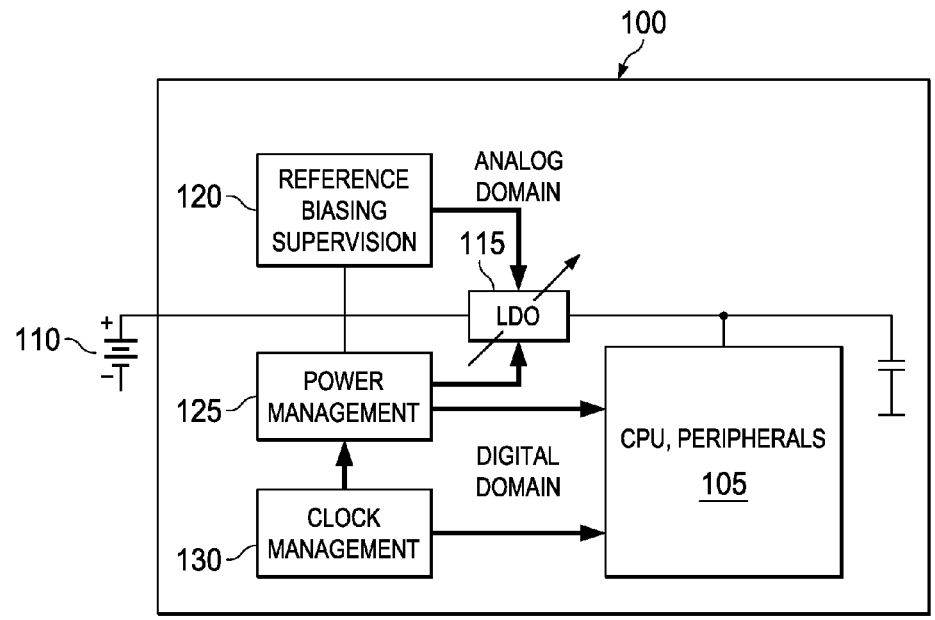
FIG. 1 comprises a block diagram of an example electronic device using a low drop-out voltage regulator as may be configured in accordance with various embodiments of the invention.
Figure 2:
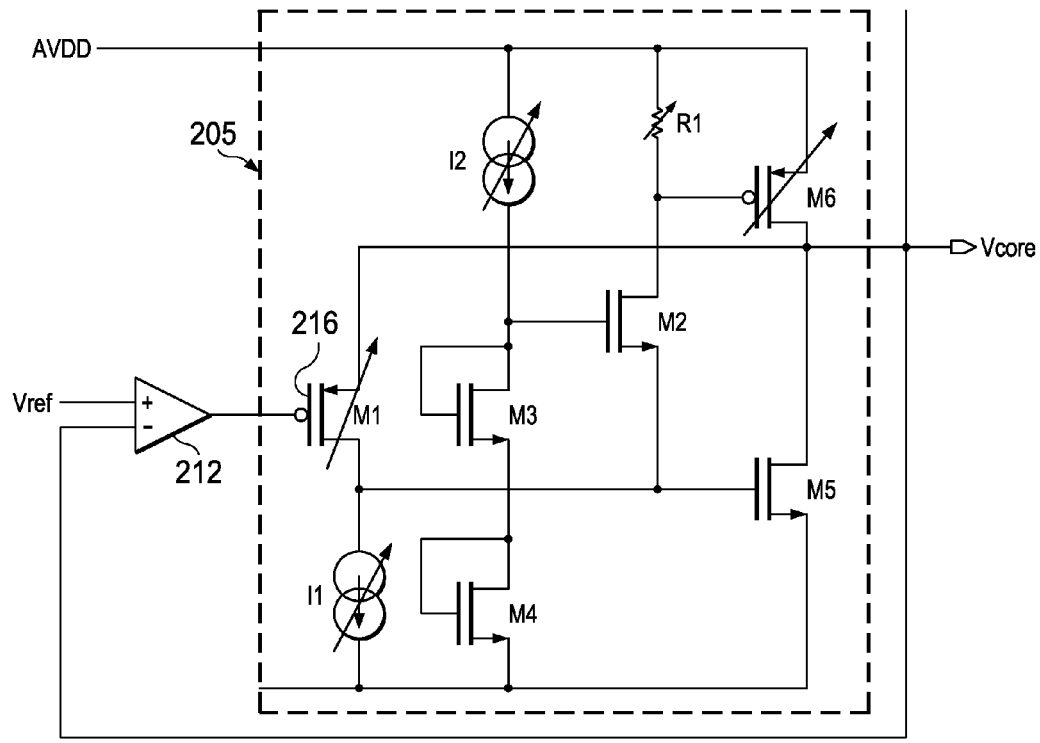
FIG. 2 comprises a circuit diagram of a prior art of a low drop-out voltage regulator.
Figure 3:
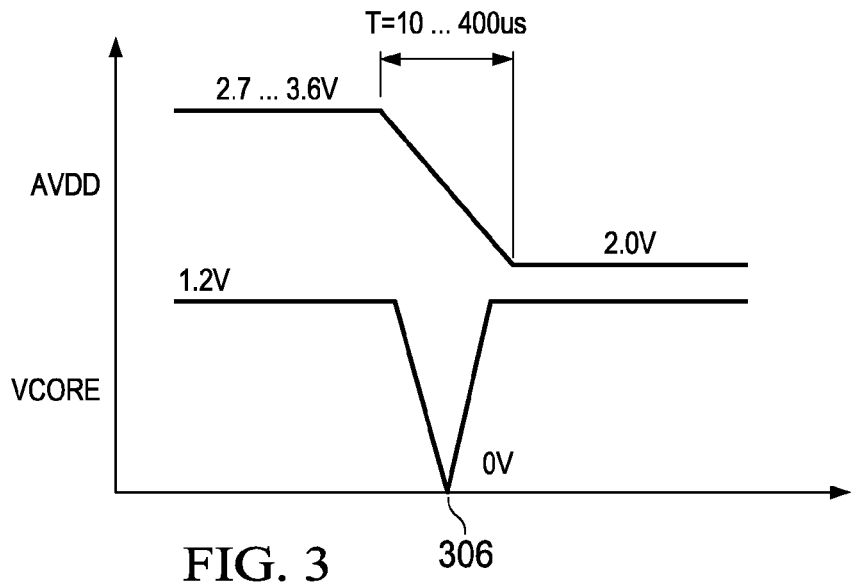
FIG. 3 comprises a graph showing a possible drop in an output voltage VCORE relative to a drop in input voltage AVDD as may occur for some voltage regulators.
Figure 8A:
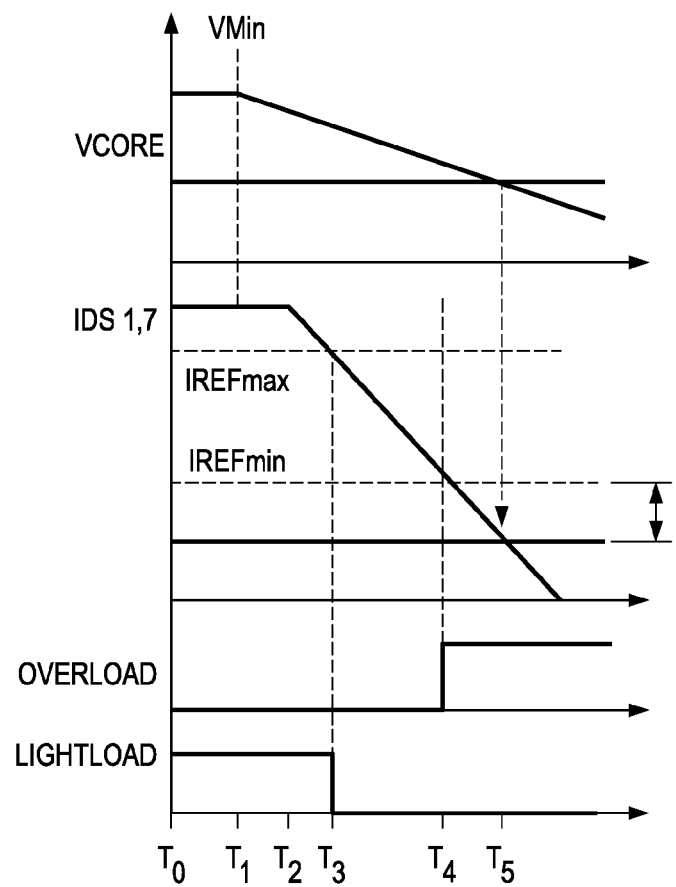
FIG. 8A comprises a graph illustrating potential output voltages with respect to monitored currents in either an overload or light load condition as may be monitored in accordance with various embodiments of the invention.
Figure 4:
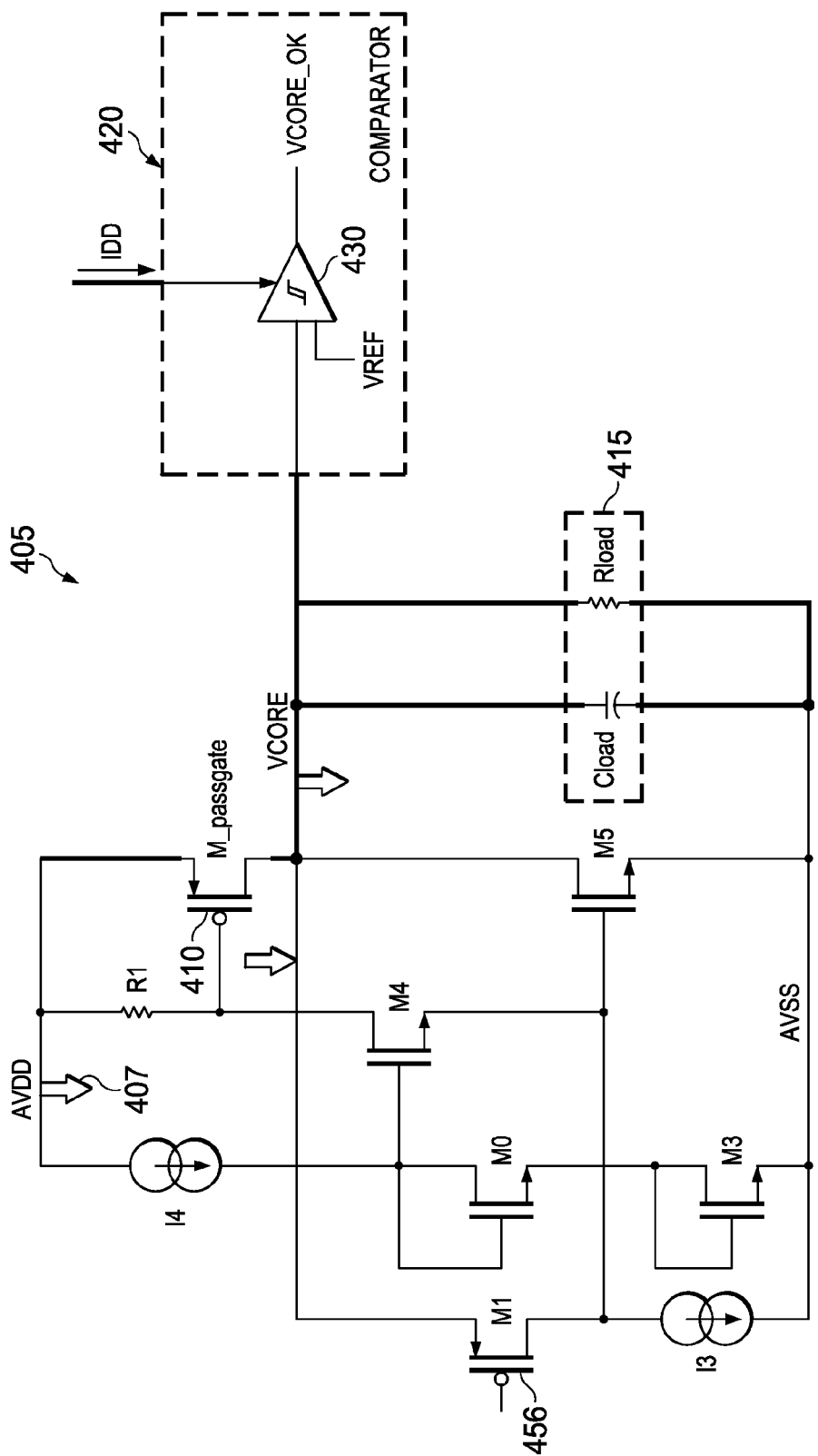
FIG. 4 comprises a circuit diagram of a low voltage drop-out regulator output stage together with a prior art voltage monitoring approach to controlling output voltage.
Figure 5:
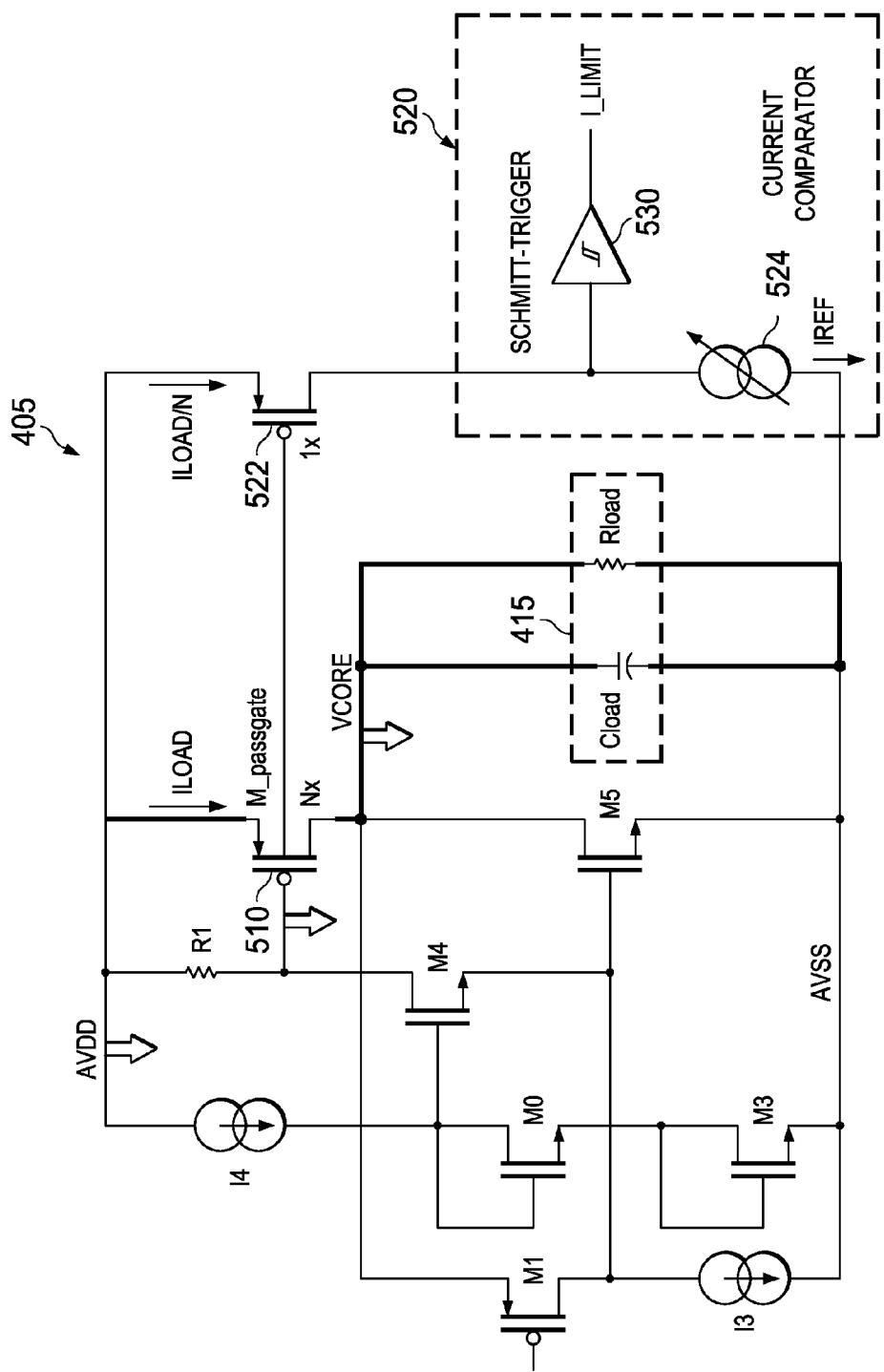
FIG. 5 comprises a circuit diagram of a low drop-out voltage regulator output stage together with a prior art current mode sensor approach for controlling output voltage.
Figure 6:
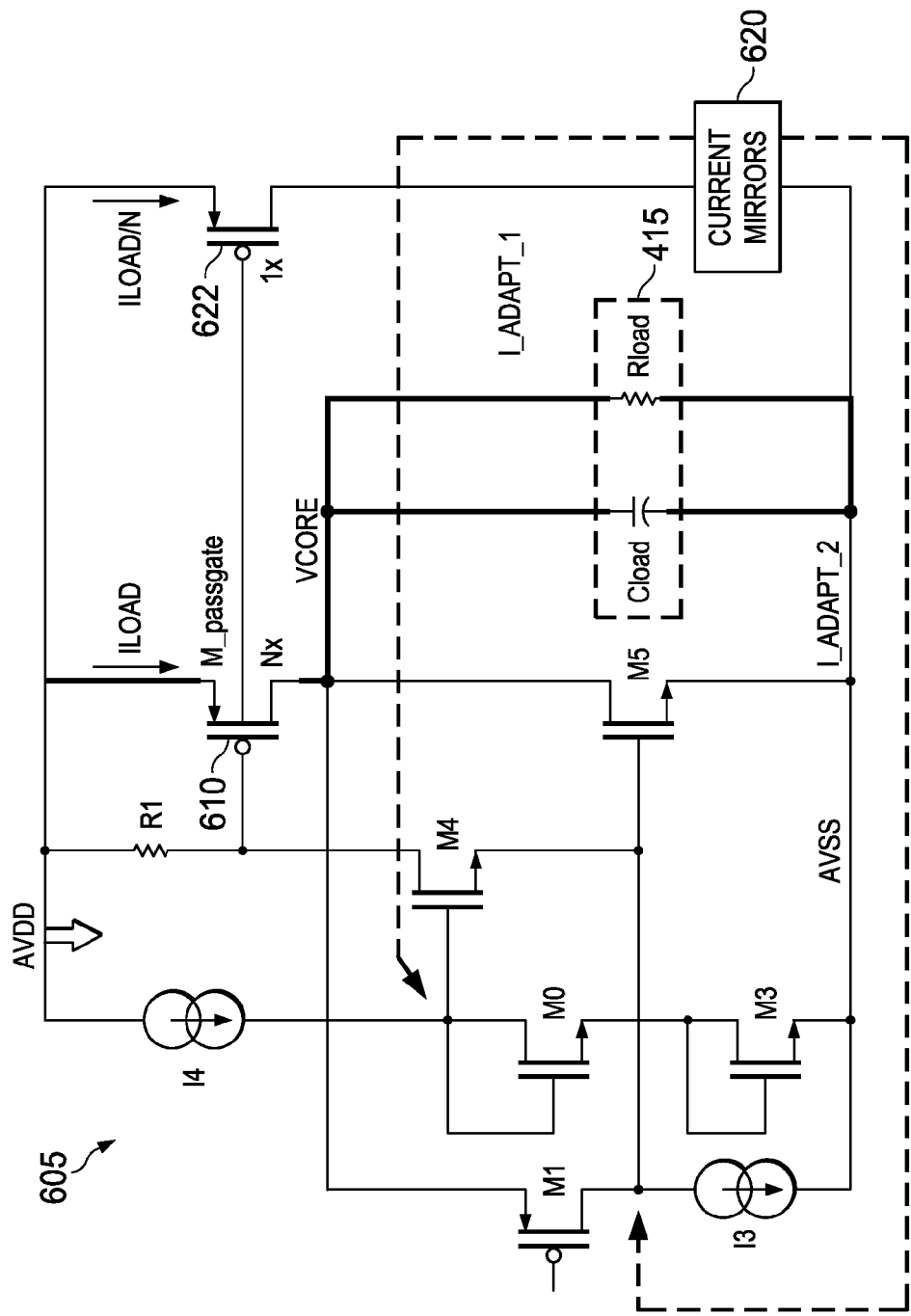
FIG. 6 comprises a circuit diagram of a low voltage drop-out regulator output stage together with a prior art current mirror sensing approach for regulating output voltage.

Another option for designing such a sensing approach is further illustrated in FIG. 8A wherein the sensing approach can be adapted to sense not only an overload condition, but also a light load condition for the low drop-out voltage regulator circuit. In this situation, when there is a light load on the power source, the output voltage VCORE may actually be unnecessarily high for the present operating environment. In such a situation, the low drop-out voltage regulator circuit and potentially other elements of the electronic device can be switched to a low power configuration, as long as there is merely a light load to which output power needs to be provided. In such an approach, the reference current IREF can be switched to a higher IREF MAX level wherein currents sensed above the IREF MAX level indicate a light load condition instead of providing a minimum current IREF MIN used to detect an overload condition. In FIG. 8A, this condition is present during the timeframe between time T-0 and time T-3. In this light load condition, there is minimum drain or pull on the output voltage VCORE, which in turn, manifests as a current IDS7 being higher than the reference current IREF MAX. The comparator circuit 770 of FIG. 7 in this situation, can then provide an output signal indicating that the current IDS7 is higher than the reference current IREF MAX, which signal when received by a controller can allow the controller to change settings for the low drop-out voltage regulator circuit and other elements to use less power until a time such as T-3 when the sensed current IDS7 drops below the IREF MAX, indicating the end of the light load condition. In this manner, the controller receiving a signal from the comparator circuit 770 can dynamically adjust the settings of various aspects of the circuit to actively manage the power levels of the circuit to reduce power consumption during run-time.

Figure 8B:
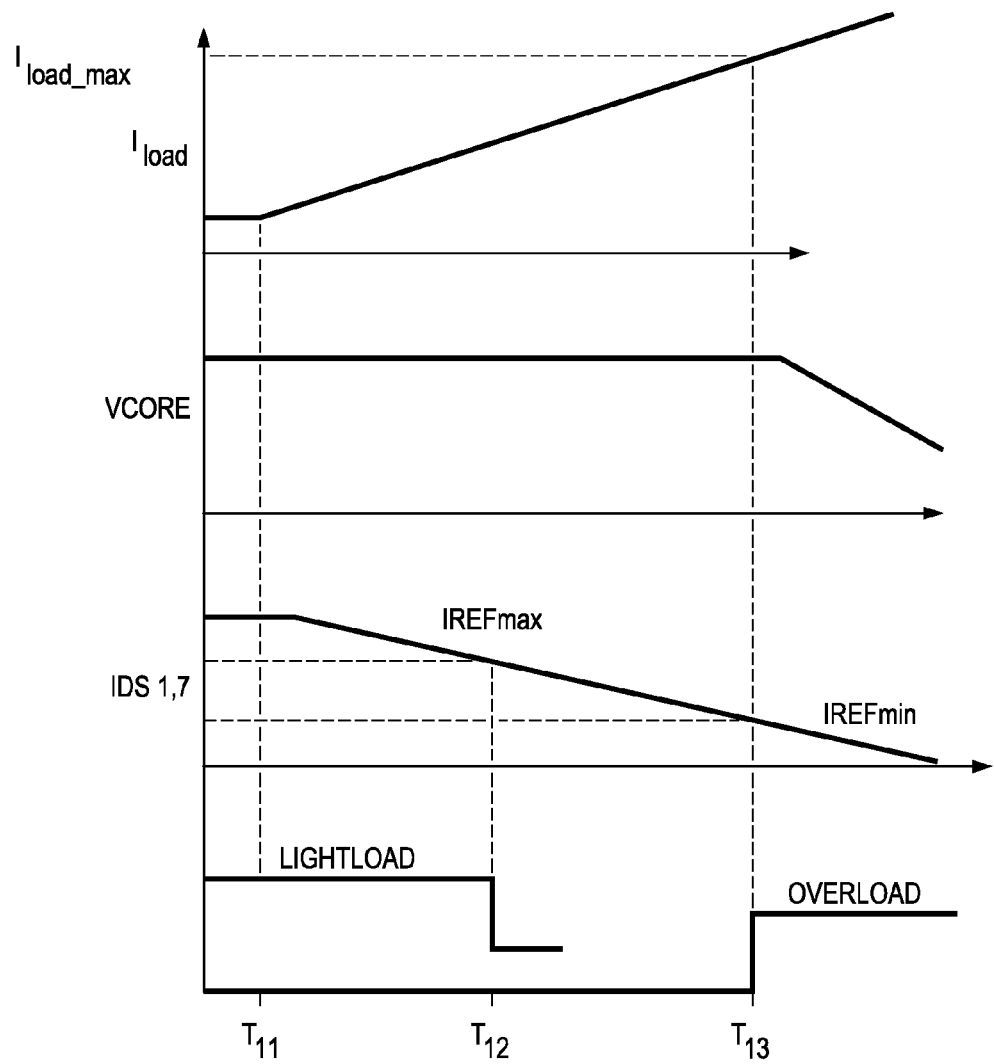
FIG. 8B comprises a graph illustrating potential output currents with a constant output voltage and with respect to monitored currents in either an overload or light load condition as may be monitored in accordance with various embodiments of the invention.

In addition to detecting voltage drops and light load situations, the described approaches may also detect overload current conditions. As illustrated in FIG. 8B, an output current provided to a load ILOAD can fluctuate without appreciable change in the output voltage VCORE. Here, the load current ILOAD starts rising at a time T-11. Because of the circuit design described herein, the low drop-out voltage regulator circuit current IDS1 and sensing current IDS7 will vary inversely with the load current ILOAD when the output voltage VCORE is constant, accordingly starting to drop at T-11. At time T-12 the sensing current crosses a threshold current IREF MAX thereby indicating that the circuit has passed from a light current load condition to a normal current load condition, which condition shift is sensed by the current mode comparator circuit. As the load current ILOAD continues to rise with a constant output voltage VCORE, the sensing current IDS7 continues to drop until it crosses at time T-13 a further threshold IREF MIN thereby indicating to the current mode comparator circuit that the circuit has passed from a normal current state to an overload current state.

Figure 9:
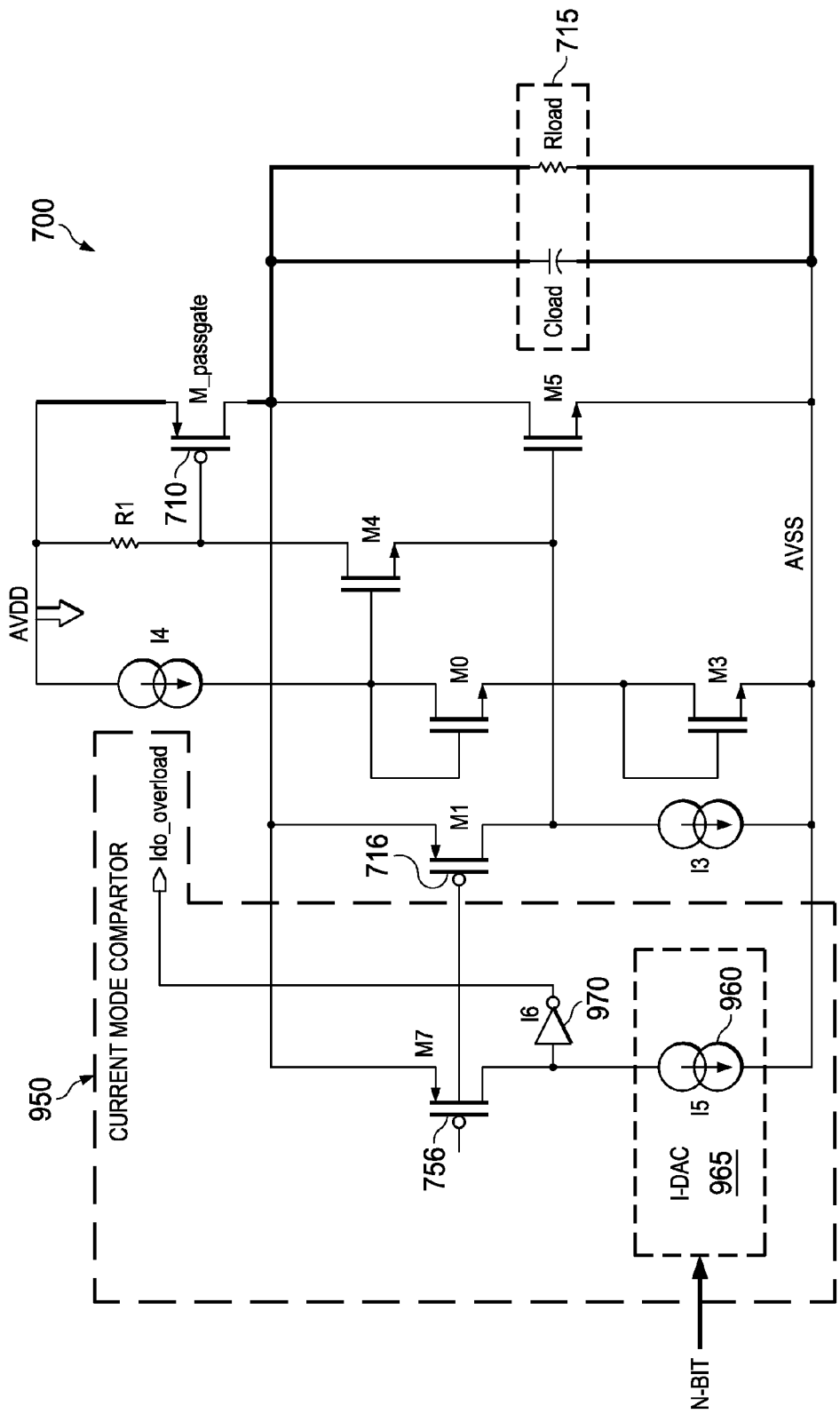
FIG. 9 comprises a circuit diagram of an example approach to monitoring and controlling a low drop-out voltage regulator circuit as configured in accordance with various embodiments of the invention.

FIG. 9 illustrates one approach to implementing such dynamic control over an electronic device. In this example, the current mode comparator circuit 950 that is connected to sense current from the low drop-out voltage circuit output stage 700 includes an N-bit digital to analog conversion circuit 965 configured to control the reference current source 960 to output a high reference current. In this approach, the comparator circuit 970 is configured to output a digital flag signal in response to sensing current exceeding the high reference current. Thus, a controller connected to control the elements including the reference current source 960 and the comparator circuit 970 can actively monitor and control power usage of the electronic device in a manner similar to that described above with respect to FIG. 8.

Figure 10:
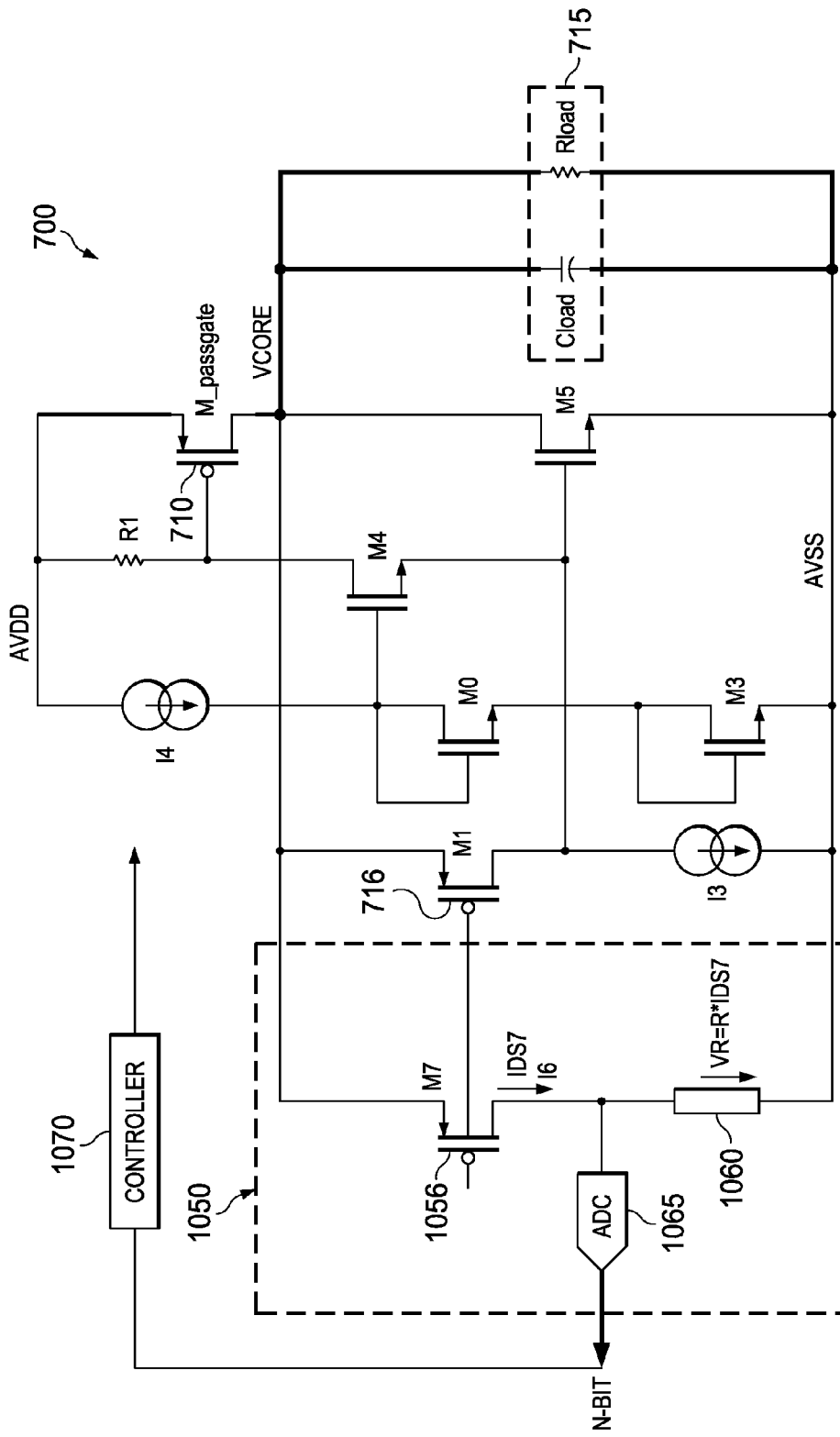
FIG. 10 comprises a circuit diagram of an example approach to monitoring and controlling a low drop-out voltage regulator circuit as configured in accordance with various embodiments of the invention.

Still another example of monitoring and controlling a voltage provider circuit is illustrated in FIG. 10. In this approach, the current mode comparator circuit 1050 includes a sensing transistor 1056 connected and parallel with the feedback loop transistor 716, and configured to output a sensing current IDS7 proportional to the low drop-out voltage regulator circuit current passing through the feedback loop transistor 716. A resistive element 1060 is connected to have the sensing current IDS7 pass through the resistive element 1060 to provide a sensing voltage VR that is proportional to the sensing current IDS7. In this approach, instead of using a current based comparator circuit, an N-bit analog to digital comparator circuit 1065 is connected to convert the sensing voltage VR to a digital output. The digital output can have as many bits as needed to provide sufficient information regarding the output load of the low drop-out voltage regulator circuit 700. This information is received by a controller device 1070. The controller device 1070 is configured to receive the digital output and control the low drop-out voltage regulator circuit 700 to operate at a low power setting in response to the digital output's indicating the sensing current IDS7 is exceeding a high current threshold. Similarly, the controller device 1070 can control the low drop-out voltage regulator circuit to operate in a higher power setting in response to the digital output's indicating the sensing current IDS7 is dropping below a given low current threshold, such as in an overload situation.

So configured, the basic approach of using a discrete time mixed analog/digital approach can be modified readily to expand the responsiveness of controlling a power voltage provider such as a low drop-out voltage regulator. These approaches are fast and highly adaptive to a given situation. Moreover, these approaches generally consume less power and less silicon space as compared to other approaches given the limited number of elements needed to be added to the low drop-out voltage regulator circuit to monitor its performance.

Example methods of operation for such power provision circuits will be described with reference to FIG. 11. By one approach, a method for detecting the load experienced by a power provider includes a low drop-out voltage regulator circuit providing 1110 an output voltage to a load. A low drop-out voltage regulator circuit current driven by the output voltage of the low drop-out voltage regulator circuit is monitored 1120 in a discrete time mixed analog/digital approach with a current load comparator circuit. The low drop-out voltage regulator circuit current driven by the output voltage is passed 1130 through a feedback loop transistor of the low drop-out voltage regulator circuit. In one example, the feedback loop transistor is a PMOS transistor having a drain and a source with the source connected to receive the output voltage. In this case, the method includes emitting the low drop-out voltage regulator circuit current from the drain of the feedback loop transistor. A sensing current proportional to the low drop-out voltage regulator circuit current is output 1140 from a sensing transistor of the current load of comparator circuit. The sensing transistor is connected in parallel with the feedback loop transistor. The sensing of the sensing current can be accomplished and fed back to a controller in a variety of ways. By one approach, a comparator circuit compares 1152 the sensing current to a reference current. The comparator circuit then outputs 1154 a comparison signal based on the comparison of the sensing current and the reference current. Where the output comparison signal is merely a 1-bit flag, the comparator circuit may be a Schmitt-Trigger circuit outputting a digital flag signal in response to the sensing current dropping below the reference current. The reference current can be set 1156 based on the desired operating parameters of the given circuit. By one approach, the reference current may be set 1156 by having an N-bit digital to analog conversion circuit of the comparator circuit control the reference current to be either a high reference current or a low reference current, depending on the circuit state desired to be monitored. The comparator circuit in this case outputs a digital flag signal in response to the sensing current exceeding the high reference current or dropping below a low reference current.

Figure 11:
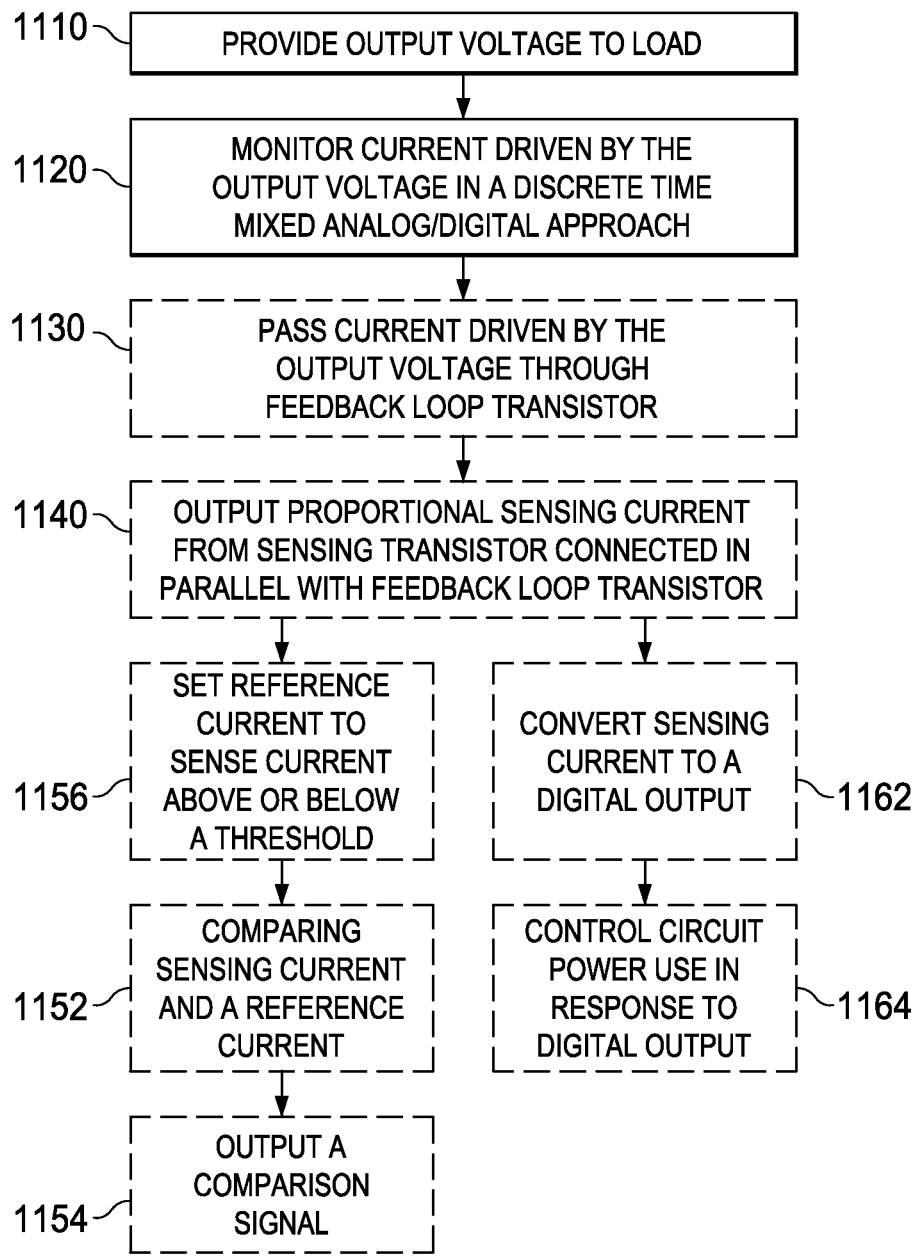
FIG. 11 comprises a flow diagram of example approaches to monitoring and controlling a low drop-out voltage regulator circuit as configured in accordance with various embodiments of the invention.

By another approach illustrated on the right hand side of FIG. 11, an N-bit analog to digital comparator circuit converts 1162 a sensing voltage derived from the sensing current to a digital output. The method may further include a controller device receiving the digital output and controlling 1164 the low drop-out voltage regulator circuit to operate, for example, in a low power setting in response to the digital output's indicating that the sensing current is exceeding a high current threshold. Similarly, the controller device may control the low drop-out voltage regulator circuit to operate in a high power setting in response to the digital output's indicating that the sensing current drops below a low current threshold, such as in an overload situation.

So configured, the proposed approaches can monitor a relevant low drop-out voltage regulator circuit operating point other than the output voltage to sense more quickly potential failures in provision of adequate output voltage. The circuit is simple and robust to implement, and typically only a small fraction of bias current is needed to effect the comparison. The silicon area overhead is small compared to other approaches to monitoring the low drop-out voltage regulator output voltage, and in certain applications, the quiescent current overhead can be made very small. In one application, the current overhead for implementing such a solution was about 10 nanoamps whereas a reasonably fast output comparator used in various prior approaches can consume up to or around 100 nanoamps depending on its speed. Moreover, in contrast to certain control schemes that require several look-up tables that lack flexibility and power efficiency, various proposed approaches can react on the actual low drop-out voltage regulator circuit loading situation as opposed to acting in a predictive state. Thus, more power is typically consumed in calculating the predictive state as opposed to simply monitoring the current state of the device as described.

Those skilled in the art will recognize that a wide variety of modifications, alterations, and combinations can be made with respect to the above described embodiments without departing from the scope of the invention. Such modifications, alterations, and combinations are to be viewed as being within the ambient of the inventive concept.

What is claimed is:

1. An apparatus for detecting load on an input power, the apparatus comprising:
   a low dropout voltage regulator circuit configured to provide an output voltage to a load;
   a current mode comparator circuit connected to the low dropout voltage regulator circuit to monitor a low dropout voltage regulator circuit current driven by the output voltage of the low dropout voltage regulator circuit;
   wherein the current mode comparator circuit is configured to monitor the low dropout voltage regulator circuit current in a discrete time mixed analog/digital approach;
   wherein the low dropout voltage regulator circuit comprises a feedback loop transistor connected to pass the low dropout voltage regulator circuit current driven by the output voltage; and
   wherein the current mode comparator circuit comprises:
   a sensing transistor connected in parallel with the feedback loop transistor and configured to output a sensing current proportional to the low dropout voltage regulator circuit current;
   a reference current source configured to provide a reference current;
   a comparator circuit configured to perform a comparison between the sensing current and the reference current and to output a comparison signal based on the comparison;
   wherein the current mode comparator circuit comprises an n-bit digital to analog conversion circuit configured to control the reference current source to output a high reference current, wherein the comparator circuit is configured to output a digital flag signal in response to the sensing current exceeding the high reference current.

2. An apparatus for detecting load on an input power, the apparatus comprising:
   a low dropout voltage regulator circuit configured to provide an output voltage to a load;
   a current mode comparator circuit connected to the low dropout voltage regulator circuit to monitor a low dropout voltage regulator circuit current driven by the output voltage of the low dropout voltage regulator circuit;
   wherein the current mode comparator circuit is configured to monitor the low dropout voltage regulator circuit current in a discrete time mixed analog/digital approach;
   wherein the low dropout voltage regulator circuit comprises a feedback loop transistor connected to pass the low dropout voltage regulator circuit current driven by the output voltage; and
   wherein the current mode comparator circuit comprises:
   a sensing transistor connected in parallel with the feedback loop transistor and configured to output a sensing current proportional to the low dropout voltage regulator circuit current;
   a resistive element connected to have the sensing current pass through the resistive element to provide a sensing voltage proportional to the sensing current;
   an n-bit analog to digital comparator circuit connected to convert the sensing voltage to a digital output;
   further comprising a controller device configured to receive the digital output and control the low dropout voltage regulator circuit to operate in a low power setting in response to the digital output's indicating the sensing current is exceeding a high current threshold.

3. An apparatus for detecting load on an input power, the apparatus comprising:
   a low dropout voltage regulator circuit configured to provide an output voltage to a load;
   a current mode comparator circuit connected to the low dropout voltage regulator circuit to monitor a low dropout voltage regulator circuit current driven by the output voltage of the low dropout voltage regulator circuit;
   wherein the current mode comparator circuit is configured to monitor the low dropout voltage regulator circuit current in a discrete time mixed analog/digital approach;
   wherein the low dropout voltage regulator circuit comprises a feedback loop transistor connected to pass the low dropout voltage regulator circuit current driven by the output voltage; and
   wherein the current mode comparator circuit comprises:
   a sensing transistor connected in parallel with the feedback loop transistor and configured to output a sensing current proportional to the low dropout voltage regulator circuit current;
   a reference current source configured to provide a reference current;
   a comparator circuit configured to perform a comparison between the sensing current and the reference current and to output a comparison signal based on the comparison;
   wherein the feedback loop transistor is a PMOS transistor having a drain and a source with the source connected to receive the output voltage, wherein the low dropout voltage regulator circuit current is current emitted from the drain.

4. A method of detecting load on a microcontroller, the method comprising:
   a low dropout voltage regulator circuit providing an output voltage to a load;
   monitoring a low dropout voltage regulator circuit current driven by the output voltage of the low dropout voltage regulator circuit in a discrete time mixed analog/digital approach with a current mode comparator circuit;
   passing the low dropout voltage regulator circuit current driven by the output voltage through a feedback loop transistor of the low dropout voltage regulator circuit;
   outputting a sensing current proportional to the low dropout voltage regulator circuit current from a sensing transistor of the current mode comparator circuit, the sensing transistor connected in parallel with the feedback loop transistor;
   a comparator circuit comparing the sensing current and a reference current;
   the comparator circuit outputting a comparison signal based on the comparison of the sensing current and the reference current;
   an n-bit digital to analog conversion circuit of the comparator circuit controlling the reference current to be a high reference current; and
   the comparator circuit outputting the digital flag signal in response to the sensing current exceeding the high reference current.

5. A method of detecting load on a microcontroller, the method comprising:
   a low dropout voltage regulator circuit providing an output voltage to a load;
   monitoring a low dropout voltage regulator circuit current driven by the output voltage of the low dropout voltage regulator circuit in a discrete time mixed analog/digital approach with a current mode comparator circuit;
   passing the low dropout voltage regulator circuit current driven by the output voltage through a feedback loop transistor; and outputting a sensing current proportional to the low dropout voltage regulator circuit current from a sensing transistor connected in parallel with the feedback loop transistor;

an n-bit analog to digital comparator circuit converting a sensing voltage derived from the sensing current to a digital output;

a controller device receiving the digital output and controlling the low dropout voltage regulator circuit to operate in a low power setting in response to the digital output's indicating the sensing current is exceeding a high current threshold.

6. A method of detecting load on a microcontroller, the method comprising:

a low dropout voltage regulator circuit providing an output voltage to a load;

monitoring a low dropout voltage regulator circuit current driven by the output voltage of the low dropout voltage regulator circuit in a discrete time mixed analog/digital approach with a current mode comparator circuit;

passing the low dropout voltage regulator circuit current driven by the output voltage through a feedback loop transistor of the low dropout voltage regulator circuit;

outputting a sensing current proportional to the low dropout voltage regulator circuit current from a sensing transistor of the current mode comparator circuit, the sensing transistor connected in parallel with the feedback loop transistor;

a comparator circuit comparing the sensing current and a reference current;

the comparator circuit outputting a comparison signal based on the comparison of the sensing current and the reference current;

a Schmitt-Trigger circuit of the comparator circuit outputting a digital flag signal in response to the sensing current dropping below the reference current;

wherein the feedback loop transistor is a PMOS transistor having a drain and a source with the source connected to receive the output voltage, the method further comprising emitting the low dropout voltage regulator circuit current from the drain.

7. An apparatus for detecting load on an input power, the apparatus comprising:

a low dropout voltage regulator circuit configured to provide an output voltage to a load, the low dropout voltage regulator circuit comprising a feedback loop transistor comprising a PMOS transistor having a drain and a source with the source connected to receive the output voltage, wherein a low dropout voltage regulator circuit current driven by the output voltage is current emitted from the drain;

a current mode comparator circuit connected to the low dropout voltage regulator circuit to monitor the low dropout voltage regulator circuit current;

wherein the current mode comparator circuit comprises a sensing transistor connected in parallel with the feedback loop transistor and configured to output a sensing current proportional to the low dropout voltage regulator circuit current.

8. The apparatus of claim 7 wherein the current mode comparator circuit comprises:

a reference current source configured to provide a reference current;

a comparator circuit configured to perform a comparison between the sensing current and the reference current and to output a comparison signal based on the comparison.

9. The apparatus of claim 8 wherein the comparator circuit comprises a Schmitt-Trigger circuit configured to output a digital flag signal in response to the sensing current dropping below the reference current.

10. The apparatus of claim 8 wherein the current mode comparator circuit comprises an n-bit digital to analog conversion circuit configured to control the reference current source to output a high reference current, wherein the comparator circuit is configured to output a digital flag signal in response to the sensing current exceeding the high reference current.

11. The apparatus of claim 7 wherein the current mode comparator circuit comprises:

a resistive element connected to have the sensing current pass through the resistive element to provide a sensing voltage proportional to the sensing current;

an n-bit analog to digital comparator circuit connected to convert the sensing voltage to a digital output.

12. The apparatus of claim 7 further comprising a controller device configured to receive output from the current mode comparator circuit and control the low dropout voltage regulator circuit to operate in a low power setting in response to the output's indicating the sensing current is exceeding a high current threshold.

* * * * *